(12) United States Patent
Nishimura et al.

(10) Patent No.: US 8,604,844 B2
(45) Date of Patent: Dec. 10, 2013

(54) OUTPUT CIRCUIT

(75) Inventors: Kouichi Nishimura, Kanagawa (JP); Hiromichi Ohtsuka, Kanagawa (JP); Toshikazu Murata, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 194 days.

(21) Appl. No.: 13/195,546

(22) Filed: Aug. 1, 2011

(65) Prior Publication Data

US 2012/0049923 A1    Mar. 1, 2012

(30) Foreign Application Priority Data

Aug. 27, 2010   (JP) .................................. 2010-190684

(51) Int. Cl.
*H03K 3/00* (2006.01)

(52) U.S. Cl.
USPC ............ 327/112; 327/109; 327/309; 327/321

(58) Field of Classification Search
USPC .................................. 327/109, 112, 309, 321
See application file for complete search history.

(56) References Cited

U.S. PATENT DOCUMENTS

| | | | | |
|---|---|---|---|---|
| 5,079,608 A | * | 1/1992 | Wodarczyk et al. | 257/355 |
| 5,347,169 A | | 9/1994 | Preslar et al. | |
| 5,475,258 A | * | 12/1995 | Kato et al. | 257/603 |
| 7,167,030 B2 | | 1/2007 | Kitagawa et al. | |
| 7,327,546 B2 | * | 2/2008 | Thiery | 361/100 |
| 2006/0006853 A1 | * | 1/2006 | Thiery | 323/276 |
| 2008/0186004 A1 | * | 8/2008 | Williams | 323/282 |
| 2008/0284489 A1 | * | 11/2008 | Low | 327/359 |
| 2009/0001410 A1 | * | 1/2009 | Shigeta et al. | 257/133 |
| 2009/0052211 A1 | * | 2/2009 | Asai | 363/56.05 |
| 2009/0201237 A1 | | 8/2009 | Nishimura | |
| 2009/0219661 A1 | * | 9/2009 | Mitsuda | 361/92 |
| 2009/0250759 A1 | * | 10/2009 | Otake | 257/356 |

FOREIGN PATENT DOCUMENTS

| | | |
|---|---|---|
| JP | 3-117017 A | 5/1991 |
| JP | 7-505994 A | 6/1995 |
| JP | 4228960 B2 | 2/2009 |
| JP | 2009-194485 A | 8/2009 |

* cited by examiner

*Primary Examiner* — Ryan Jager
(74) *Attorney, Agent, or Firm* — Sughrue Mion, PLLC

(57) ABSTRACT

An output circuit includes a first output transistor disposed between a higher-potential power supply terminal and an external output terminal, a current flowing from the source of the first output transistor to the drain thereof being controlled on the basis of an external input signal; a second output transistor disposed between a lower-potential power supply terminal and the external output terminal, a current flowing from the source of the second output transistor to the drain thereof being controlled on the basis of an external input signal; and a clamping transistor having a first terminal and a control terminal, the first terminal and the control terminal being coupled to the gate of the first output transistor, and a second terminal coupled to the drain of the first output transistor.

5 Claims, 13 Drawing Sheets

POSITIVE AMPLIFIER

NEGATIVE AMPLIFIER

POSITIVE AMPLIFIER

NEGATIVE AMPLIFIER

POSITIVE AMPLIFIER

NEGATIVE AMPLIFIER

POSITIVE AMPLIFIER

NEGATIVE AMPLIFIER

OUTPUT CIRCUIT

CROSS-REFERENCE TO RELATED APPLICATIONS

The disclosure of Japanese Patent Application Publication No. 2010-190684 filed on Aug. 27, 2010 including the specification, drawings and abstract is incorporated herein by reference in its entirety.

BACKGROUND

The present invention relates to an output circuit and in particular to an output circuit that is suitable for suppressing overshoot or undershoot of its output waveform.

Liquid crystal display (LCD) drivers for driving an LCD include a voltage-follower-coupled operational amplifier as an output drive circuit. The transient characteristics of this operational amplifier are known to significantly affect display quality. In particular, overshoot or undershoot of its output waveform disadvantageously degrades image quality. Accordingly, an operational amplifier included in an LCD driver is required to suppress overshoot or undershoot of its output waveform.

However, the transconductance gm of an MOS transistor is generally lower than that of a bipolar transistor. For this reason, when an operational amplifier including an MOS analog drives a capacitive load, it disadvantageously tends to cause overshoot or undershoot in its drive waveform. Countermeasures to this problem include a method of increasing the W size of an output MOS transistor included in the operational amplifier to increase the transconductance gm. However, an increase in the W size of the output MOS transistor increases chip size, resulting in an increase in cost.

FIGS. 7A and 7B show equivalent circuits of an amplifier solely for positive voltages (hereafter referred to as a positive amplifier) 100 and an amplifier solely for negative voltages (hereafter referred to as a negative amplifier) 200 disclosed in Japanese Patent Application Publication No. 2009-194485. Specifically, FIGS. 7A and 7B show operational amplifiers for half_VDD which have been used in LCD drivers in recent years.

The positive amplifier 100 in FIG. 7A is an amplifier for driving voltages higher than a reference voltage COM (a reference voltage applied to the counter electrode of liquid crystal) in a liquid crystal display. The negative amplifier 200 shown in FIG. 7B is an amplifier for driving voltages lower than the reference voltage COM. As seen, in the field of liquid crystal displays, a voltage is determined to be positive or negative relative to the reference voltage COM. These positive and negative voltages are different from positive and negative voltages in general electrical engineering.

The positive amplifier 100 is an amplifier for driving the positive polarity of liquid crystal. Accordingly, if the reference voltage COM is a voltage halving the difference between a power supply voltage VDD and a ground voltage VSS, that is, VDD/2, the positive amplifier 100 is only required to drive voltages ranging from VDD/2 to VDD. On the other hand, the negative amplifier 200 is an amplifier for driving the negative polarity of the liquid crystal and therefore is only required to drive voltages ranging from VSS to VDD/2. Thus, in both amplifiers, the range of power supply voltages applied to an output stage circuit (output circuit) is about half that of power supply voltages applied to another circuit (here, differential stage circuit), thereby suppressing increases in power consumption.

The positive amplifier 100 shown in FIG. 7A includes a differential stage circuit 101 and an output stage circuit (output circuit) 102. The output stage circuit 102 includes a p-channel MOS transistor MP103 and an n-channel MOS transistor MN104. The output stage circuit 102 has a higher-potential power supply terminal to which the power supply voltage VDD is applied and a lower-potential power supply terminal to which an intermediate voltage VML is applied. The intermediate voltage VML is about half the power supply voltage VDD. The circuit (differential stage circuit 101) other than the output stage circuit 102 has a higher-potential power supply terminal to which the power supply voltage VDD is applied and a lower-potential power supply terminal to which the ground voltage VSS is applied.

The transistor MP103 has a source to which the power supply voltage VDD is applied, a drain coupled to an external output terminal Vout, and a gate coupled to one of output terminals of the differential stage circuit 101. The transistor MN104 has a source to which the intermediate voltage VML is applied, a drain coupled to the external output terminal Vout, and a gate coupled to the other output terminal of the differential stage circuit 101.

In the positive amplifier 100 shown in FIG. 7A, the differential stage circuit 101 outputs to the output stage circuit 102 a pair of amplified signals corresponding to the potential difference between input signals applied to input terminals IN+ and IN−. In the output stage circuit 102, a current flowing from the source of the transistor MP103 to the drain thereof is controlled on the basis of the amplified signal applied to the gate thereof. Similarly, a current flowing from the source of the transistor MN104 to the drain thereof is controlled on the basis of the amplified signal applied to the gate thereof. Since the power supply voltage VDD is applied to the source of the transistor MP103 and the intermediate voltage VML is applied to the source of the transistor MN104, the voltages of output signals of the positive amplifier 100 fall within the range of VDD/2 to VDD.

The negative amplifier 200 shown in FIG. 7B includes a differential stage circuit 201 and an output stage circuit (output circuit) 202. The output stage circuit 202 includes a p-channel MOS transistor MP203 and an n-channel MOS transistor MN204. The output stage circuit 202 has a higher-potential power supply terminal to which an intermediate voltage VMH is applied and a lower-potential power supply terminal to which the ground voltage VSS is applied. The intermediate voltage VMH is about half the power supply voltage VDD. The circuit (differential stage circuit 201) other than the output stage circuit 202 has a higher-potential power supply terminal to which the power supply voltage VDD is applied and a lower-potential power supply terminal to which the ground voltage VSS is applied.

The transistor MP203 has a source to which the intermediate voltage VMH is applied, a drain coupled to an external output terminal Vout, and a gate coupled to one of output terminals of the differential stage circuit 201. The transistor MN204 has a source to which the ground voltage VSS is applied, a drain coupled to the external output terminal Vout, and a gate coupled to the other output terminal of the differential stage circuit 201.

In the negative amplifier 200 shown in FIG. 7B, the differential stage circuit 201 outputs to the output stage circuit 202 a pair of amplified signals corresponding to the potential difference between input signals applied to input terminals IN+ and IN−. In the output stage circuit 202, a current flowing from the source of the output transistor MP203 to the drain thereof is controlled on the basis of the amplified signal applied to the gate thereof. A current flowing from the source of the transistor MN204 to the drain thereof is controlled on the basis of the amplified signal applied to the gate thereof. Since the intermediate voltage VMH is applied to the source of the transistor MP203 and the ground voltage VSS is applied to the source of the transistor MN204, the voltages of output signals of the negative amplifier 200 fall within the range of VSS to VDD/2.

Circuits for controlling a current to be supplied to a load include a circuit using a clamping circuit. FIG. 8 shows a circuit diagram of a transistor output circuit disclosed in Japanese Patent Application Publication No. Hei 3(1991)-117017. A transistor output circuit 300 shown in FIG. 8 includes a gate drive circuit 301, an output transistor 302, a clamping circuit 304, and a resistor 307 and controls a current flowing into a load 305 via the output transistor 302. As shown in FIG. 9, a current Id flowing from the source of the output transistor 302 to the drain thereof increases as the gate-source voltage Vgs thereof increases. That is, when the gate-source voltage Vgs of the output transistor 302 reaches or exceeds a predetermined voltage, an overcurrent is supplied to the load 305. For this reason, the transistor output circuit 300 includes the clamping circuit 304 between the gate and source of the output transistor 302. This prevents the gate-source voltage Vgs from reaching or exceeding the predetermined voltage, suppressing an overcurrent.

Japanese Patent No. 4228960 discloses a load drive apparatus including the same conductivity type of two MOS transistors coupled in series to a path for transmitting power from a power supply to a load; and clamping circuits coupled between the gates and drains of the two MOS transistors. Each clamping circuit includes a diode for backflow prevention and a clamp Zener diode (see FIG. 5 of the Patent).

Japanese Patent Application Publication No. Hei7(1995)-505994 discloses an inductive load damp circuit including an inductive load apparatus (L1), an n-channel MOS transistor (N1) coupled in series to the inductive load apparatus (L1), and a p-channel clamping transistor (P1) coupled between the gate and drain of the transistor (N1) (see FIG. 3 of the Publication). A power supply voltage Vcc is applied to the gate of the clamping transistor (P1).

SUMMARY

As described above, amplifiers including an output circuit according to the related art generally disadvantageously tend to cause overshoot or undershoot in their output waveform.

In Japanese Patent Application Publication No. 2009-194485, as shown in FIGS. 7A and 7B, the range of power supply voltages applied to the output stage circuit (output circuit) is about half that of power supply voltages applied to the differential stage circuit. For this reason, the two output transistors disposed in the output stage circuit have different gate-source voltage ranges.

For example, in the positive amplifier 100 shown in FIG. 7A, the maximum gate-source voltage of the output transistor MP103 is VDD-VSS. On the other hand, the maximum gate-source voltage of the transistor MN104 is VDD-VML. That is, the gate-source voltage of the output transistor MP103 is about twice that of the output transistor MN104. Accordingly, the positive amplifier 100 disadvantageously has the tendency to cause overshoot as a rising transient characteristic. In other words, the positive amplifier 100 disadvantageously tends to cause overshoot of the rising edge of its output waveform.

On the other hand, in the negative amplifier 200 shown in FIG. 7B, the maximum gate-source voltage of the transistor MN204 is VDD-VSS. The maximum gate-source voltage of the transistor MP203 is VMH-VSS. That is, the gate-source voltage of the output transistor MN204 is about twice that of the output transistor MP203. Accordingly, the negative amplifier 200 disadvantageously has the tendency to cause undershoot as a falling transient characteristic. In other words, the negative amplifier 200 disadvantageously tends to cause undershoot of the falling edge of its output waveform.

As seen, amplifiers including an output circuit according to the related art disadvantageously tend to cause overshoot or undershoot of their output waveform.

An output circuit according to an aspect of the present invention includes: a first output MOS transistor (for example, an output transistor MP13 according to a first embodiment) disposed between a first power supply terminal and an external output terminal, a current flowing from the source of the first output MOS transistor to the drain thereof being controlled on the basis of an external input signal; a second output MOS transistor (for example, an output transistor MN14 according to the first embodiment) disposed between a second power supply terminal and the external output terminal, a current flowing from the source of the second output MOS transistor to the drain thereof being controlled on the basis of an external input signal; and a first clamping MOS transistor (for example, a clamping transistor MP15 according to the first embodiment) having a first terminal and a control terminal, the first terminal and the control terminal being coupled to the gate of the first output MOS transistor, and a second terminal coupled to the drain of the first output MOS transistor.

A circuit configuration as described above can suppress overshoot or undershoot of the output waveform.

According to the aspects of the present invention, an output circuit can be provided which can suppress overshoot or undershoot of its output waveform.

DETAILED DESCRIPTION

Now, embodiments of the present invention will be described with reference to the accompanying drawings. The drawings are only illustrative and should not be construed as limiting the technical scope of the present invention. The same components are assigned the same symbols and will be omitted.

First Embodiment

Figure 1A:
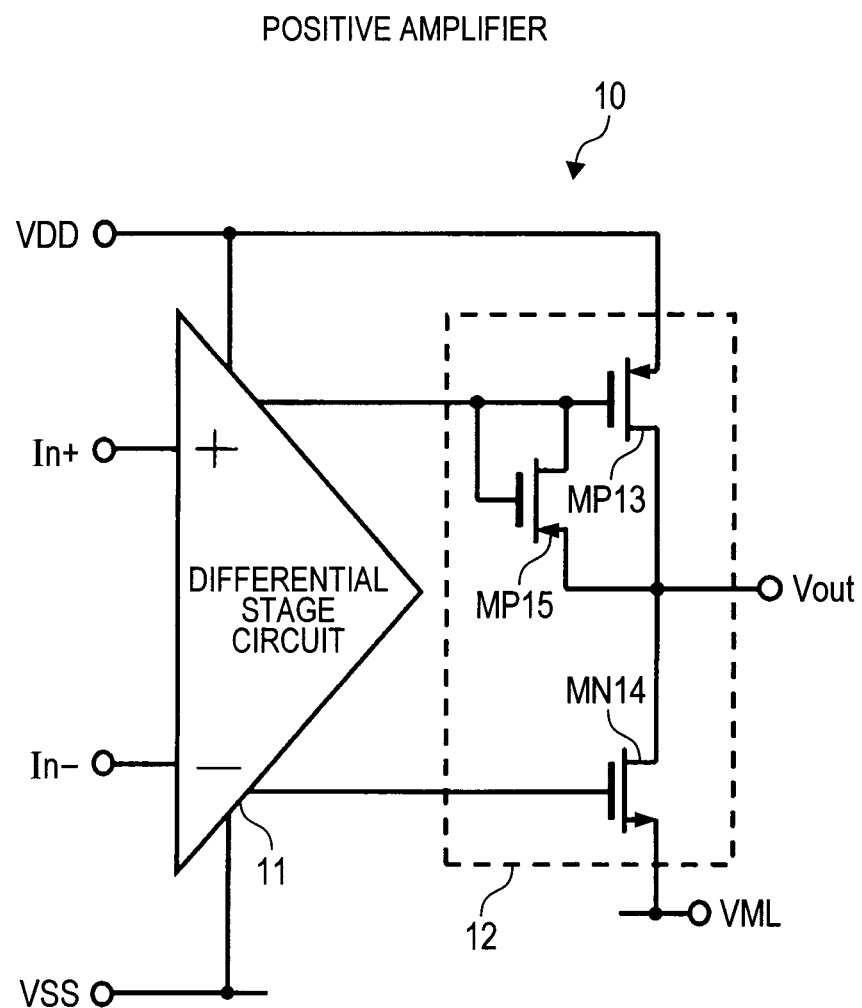
FIG. 1A is a circuit diagram showing an operational amplifier according to a first embodiment of the present invention.
Figure 1B:
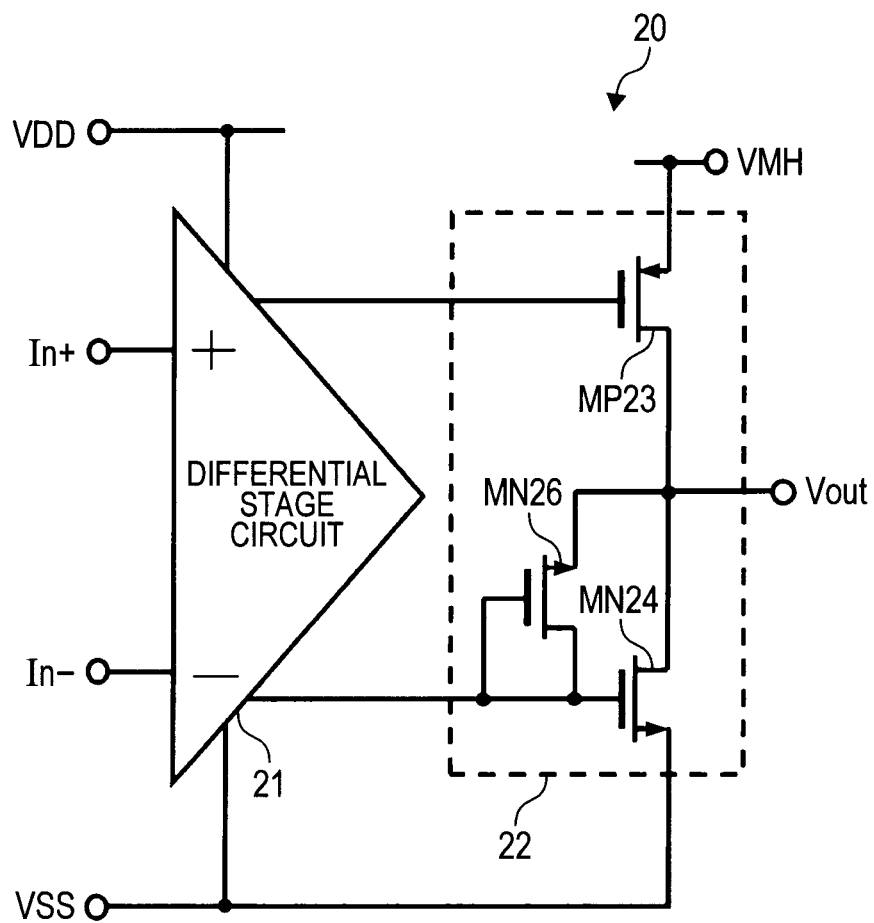
FIG. 1B is a circuit diagram showing an operational amplifier according to the first embodiment of the present invention.

FIGS. 1A and 1B show a positive amplifier 10 and a negative amplifier 20 each including an output circuit according to a first embodiment of the present invention. Specifically, FIGS. 1A and 1B show operational amplifiers for half_VDD that are used in LCD drivers and the like.

Since the positive amplifier 10 shown in FIG. 1A is an amplifier for driving the positive polarity of liquid crystal, it is only required to drive voltages ranging from (a power supply voltage VDD)/2 to VDD. On the other hand, since the negative amplifier 20 shown in FIG. 1B is an amplifier for driving the negative polarity of the liquid crystal, it is only required to drive voltages ranging from a ground voltage VSS to VDD/2. Accordingly, in both amplifiers, the range of power supply voltages applied to an output circuit is about half that of power supply voltages applied to another circuit (differential stage circuit), suppressing increases in power consumption. This embodiment will be described below specifically.

The positive amplifier 10 shown in FIG. 1A includes a differential stage circuit 11 and an output circuit 12. The output circuit 12 includes an output transistor MP13, an output transistor MN14, and a clamping transistor MP15. In this embodiment, it is assumed that the output transistor MP13 and the clamping transistor MP15 are p-channel MOS transistors and that the output transistor MN14 is an n-channel MOS transistor.

The output circuit 12 has a higher-potential power supply terminal to which the power supply voltage VDD is applied and a lower-potential power supply terminal to which an intermediate voltage VML is applied. While it is assumed in this embodiment that the intermediate voltage VML is about half the power supply voltage VDD, this is not limiting. The intermediate voltage VML may be changed to a voltage lower than half the power supply voltage VDD, as necessary. The circuit (differential stage circuit 11) other than the output circuit 12 has a higher-potential power supply terminal to which the power supply voltage VDD is applied and a lower-potential power supply terminal to which a ground voltage VSS is applied.

The output transistor MP13 has a source to which the power supply voltage VDD is applied, a drain coupled to an external output terminal Vout, and a gate coupled to one of output terminals of the differential stage circuit 11. The output transistor MN14 has a source to which the intermediate voltage VML is applied, a drain coupled to the external output terminal Vout, and a gate coupled to the other output terminal of the differential stage circuit 11. The clamping transistor MP15 has a first terminal and a gate which are commonly coupled to the gate of the output transistor MP13 and a second terminal coupled to the drain of the output transistor MP13. The first and second terminals of the clamping transistor MP15 are a set of a source and a drain which change places in accordance with the levels of voltages applied to them.

In the positive amplifier 10 shown in FIG. 1A, the differential stage circuit 11 outputs to the output circuit 12 a pair of amplified signals corresponding to the potential difference between input signals applied to input terminals IN+ and IN−. In the output circuit 12, a current flowing from the source of the output transistor MP13 to the drain thereof is controlled on the basis of the amplified signal applied to the gate thereof. A current flowing from the source of the output transistor MN14 to the drain thereof is controlled on the basis of the amplified signal applied to the gate thereof. Since the power supply voltage VDD is applied to the source of the output transistor MP13 and the intermediate voltage VML is applied to the source of the output transistor MN14, the voltages of output signals of the positive amplifier 10 fall within the range of VDD/2 to VDD.

As seen, in the positive amplifier 10, the range of power supply voltages applied to the output circuit 12 is about half that of power supply voltages applied to the differential stage circuit 11. For this reason, the two output transistors, MP13 and MN14, disposed in the output circuit 12 have different gate-source voltage ranges. Specifically, the maximum gate-source voltage of the output transistor MP13 is VDD-VSS; that of the output transistor MN14 is VDD-VML. That is, the gate-source voltage of the output transistor MP13 is about twice that of the output transistor MN14. Accordingly, if no measure is taken, the current drive capability of the output transistor MN14 becomes lower than that of the output transistor MP13. This may cause overshoot of the rising edge of the output waveform. Although the dimensions of the output transistor MN14 can be increased in accordance with the value of the intermediate voltage VML, the layout size would be increased.

For this reason, the output circuit 12 according to this embodiment causes the clamping transistor MP15 disposed between the gate and drain of the output transistor MP13 to perform clamping, suppressing overshoot of the output waveform. Specifically, when the gate voltage of the output transistor MP13 becomes lower than the drain voltage thereof by a threshold voltage Vt of the clamping transistor MP15, the clamping transistor MP15 is activated. This occurs as follows: since the potential of a first terminal (which is coupled to the gate of the output transistor MP13) of the clamping transistor MP15 becomes lower than that of a second terminal (which is coupled to the drain of the output transistor MP13) thereof, the first terminal acts as a drain and the second terminal acts as a source and thus the gate voltage of the output transistor MP13 coupled to the first terminal becomes lower than the source voltage thereof by Vt. That is, the clamping transistor MP15 is diode-coupled in the forward direction.

Accordingly, the gate voltage of the output transistor MP13 is clamped using the drain voltage thereof. More specifically, the gate voltage of the output transistor MP13 is clamped to a voltage level lower than the drain voltage thereof by the threshold voltage Vt of the clamping transistor MP15. This restricts increases in the gate-source voltage of the output transistor MP13, restricting the drain current thereof. Thus, the positive amplifier 10 can suppress overshoot of its output waveform.

On the other hand, the maximum gate-source voltage of the output transistor MN14 is VDD-VML, that is, about half that of the output transistor MP13. Accordingly, the output transistor MN14 does not need to be provided with a clamping transistor, unlike the output transistor MP13. Further, where the gate voltage of the output transistor MP13 is higher than the drain voltage thereof, the clamping transistor MP15 is diode-coupled in the reverse direction and therefore inactivated. In this state, the clamping transistor MP15 has little effect on the operation of the output transistor MP13.

The negative amplifier 20 shown in FIG. 1B includes a differential stage circuit 21 and an output circuit 22. The output circuit 22 includes an output transistor MP23, an output transistor MN24, and a clamping transistor MN26. In this embodiment, it is assumed that the output transistor MP23 is a p-channel MOS transistor and that the output transistor MN24 and the clamping transistor MN26 are n-channel MOS transistors.

The output circuit 22 has a higher-potential power supply terminal to which the intermediate voltage VML is applied and a lower-potential power supply terminal to which a ground voltage VSS is applied. While it is assumed in this embodiment that the intermediate voltage VMH is about half the power supply voltage VDD, this is not limiting. The intermediate voltage VMH may be changed to a voltage higher than the ground voltage VSS, as necessary. The circuit (differential stage circuit 21) other than the output circuit 22 has a higher-potential power supply terminal to which the power supply voltage VDD is applied and a lower-potential power supply terminal to which the ground voltage VSS is applied.

The output transistor MP23 has a source to which the intermediate voltage VMH is applied, a drain coupled to an external output terminal Vout, and a gate coupled to one of output terminals of the differential stage circuit 21. The output transistor MN24 has a source to which the ground voltage VSS is applied, a drain coupled to the external output terminal Vout, and a gate coupled to the other output terminal of the differential stage circuit 21. The clamping transistor MN26 has a first terminal and a gate (control terminal) which are commonly coupled to the gate of the output transistor MN24 and a second terminal coupled to the drain of the output transistor MN24. The first and second terminals of the clamping transistor MN26 are a set of a source and a drain which change places according to the levels of voltages applied to them.

In the negative amplifier 20 shown in FIG. 1B, the differential stage circuit 21 outputs to the output circuit 22 a pair of amplified signals corresponding to the potential difference between input signals applied to input terminals IN+ and IN−. In the output circuit 22, a current flowing from the source of the output transistor MP23 to the drain thereof is controlled on the basis of the amplified signal applied to the gate thereof. A current flowing from the source of the output transistor MN24 to the drain thereof is controlled on the basis of the amplified signal applied to the gate thereof. Since the intermediate voltage VMH is applied to the source of the output transistor MP23 and the ground voltage VSS is applied to the source of the output transistor MN24, the voltages of output signals of the negative amplifier 20 fall within the range of VSS to VDD/2.

As seen, in the negative amplifier 20, the range of power supply voltages applied to the output circuit 22 is about half that of power supply voltages applied to the differential stage circuit 21. For this reason, the two output transistors, MP23 and MN24, disposed in the output circuit 22 have different gate-source voltage ranges. Specifically, the maximum gate-source voltage of the output transistor MN24 is VDD-VSS; that of the output transistor MP23 is VDD-VMH. That is, the gate-source voltage of the output transistor MP24 is about twice that of the output transistor MN23. Accordingly, if no measure is taken, the current drive capability of the output transistor MP23 will become lower than that of the output transistor MN24 in the negative amplifier 20. This may cause undershoot of the falling edge of the output waveform. Although the dimensions of the output transistor MN23 can be increased in accordance with the value of the intermediate voltage VMH, the layout size would be increased.

For this reason, the output circuit 22 according to this embodiment causes the clamping transistor MN26 disposed between the gate and drain of the output transistor MN24 to perform clamping, suppressing undershoot of the output waveform. Specifically, when the gate voltage of the output transistor MN24 becomes higher than the drain voltage thereof by a threshold voltage Vt of the clamping transistor MN26, the clamping transistor MN26 is activated. This occurs as follows: since the potential of a first terminal (which is coupled to the gate of the output transistor MN24) of the clamping transistor MN26 becomes higher than that of a second terminal (which is coupled to the drain of the output transistor MN24) thereof, the first terminal acts as a drain and the second terminal acts as a source and thus the gate voltage of the clamping transistor MN26 coupled to the first terminal becomes higher than the source voltage thereof by Vt. That is, the clamping transistor MN26 is diode-coupled in the forward direction.

Accordingly, the gate voltage of the output transistor MN24 is clamped using the drain voltage thereof. More specifically, the gate voltage of the output transistor MN24 is clamped to a voltage level higher than the drain voltage thereof by the threshold voltage Vt of the clamping transistor MN26. This restricts increases in the gate-source voltage of the output transistor MN24, restricting the drain current thereof. Thus, the negative amplifier 20 can suppress undershoot of the output waveform.

As described above, the maximum gate-source voltage of the output transistor MP23 is VDD-VMH, that is, about half that of the output transistor MN24. Accordingly, the output transistor MP23 does not need to be provided with a clamping transistor, unlike the output transistor MN24. Further, where the gate voltage of the output transistor MN24 is lower than the drain voltage thereof, the clamping transistor MN26 is diode-coupled in the reverse direction and thus inactivated. In this state, the clamping transistor MN26 has little effect on the operation of the output transistor MN24.

Figure 3:
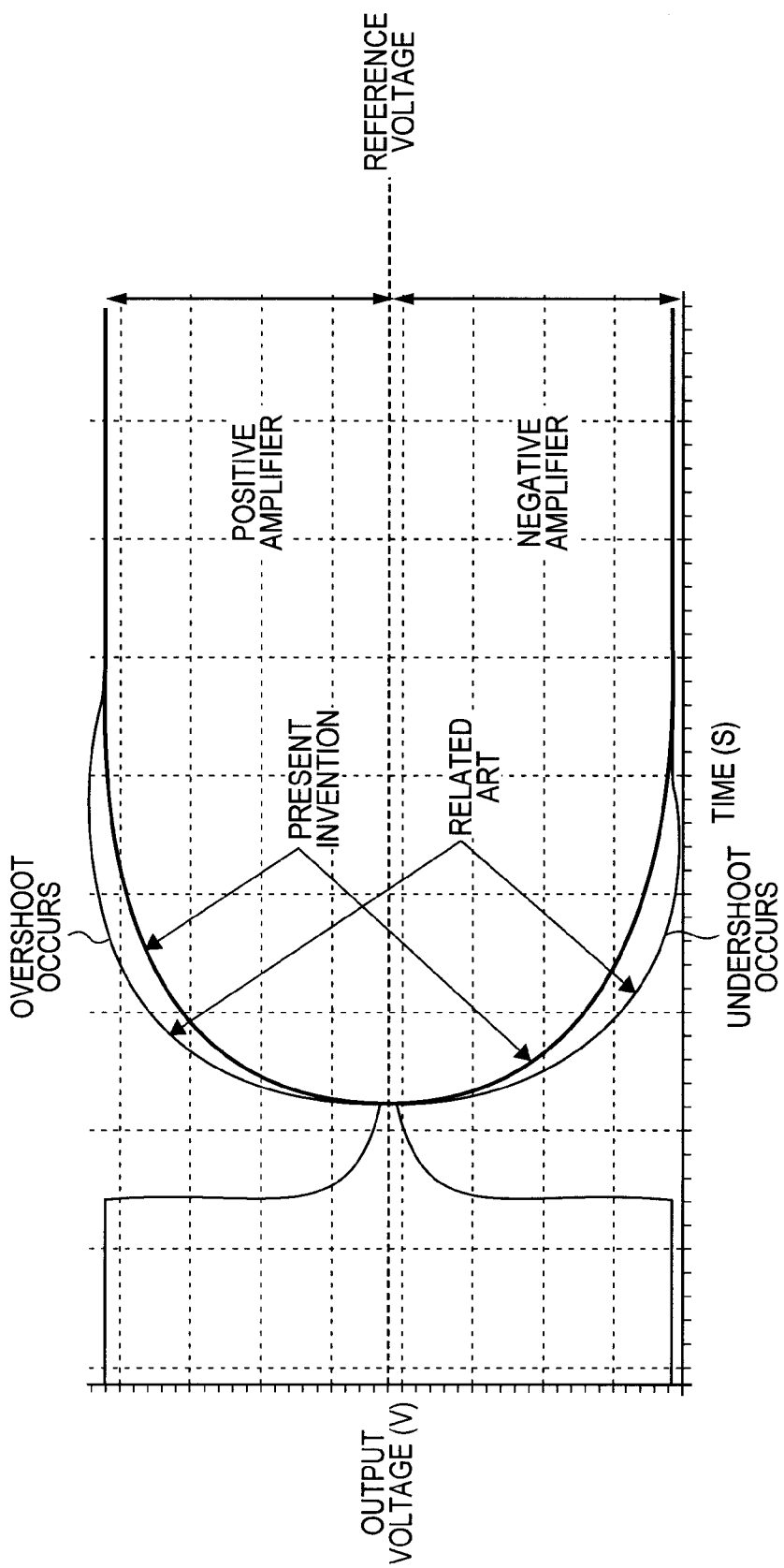
FIG. 3 is a diagram showing the output waveforms of the output circuits according to the first and second embodiments.

Next, the advantages of the output circuit according to this embodiment will be described with reference to FIG. 3. FIG. 3 includes a waveform diagram showing transient characteristics of an output of an external output terminal Vout in an amplifier including an output circuit according to the related art and a waveform diagram showing transient characteristics of an output of the external output terminal Vout in the amplifier including the output circuit according to this embodiment. The waveforms shown in FIG. 3 are obtained by plotting the results of simulations conducted under the same conditions. From these waveforms, it is understood that overshoot and undershoot have occurred in the output waveform of the output circuit according to the related art. It is also understood that overshoot and undershoot of the output waveform of the output circuit according to this embodiment have been suppressed. Note that, in the output circuit according to this embodiment, the settling time does not extend but is the same as in the related art even if overshoot and undershoot of the output waveform are suppressed.

Figure 4A:
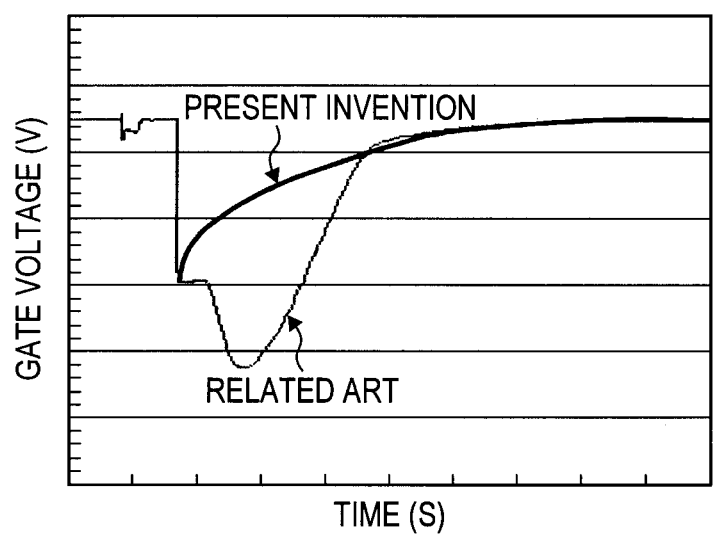
FIG. 4A is a diagram showing variations in the gate voltages of output transistors disposed in the output circuits according to the first and second embodiments.
Figure 4B:
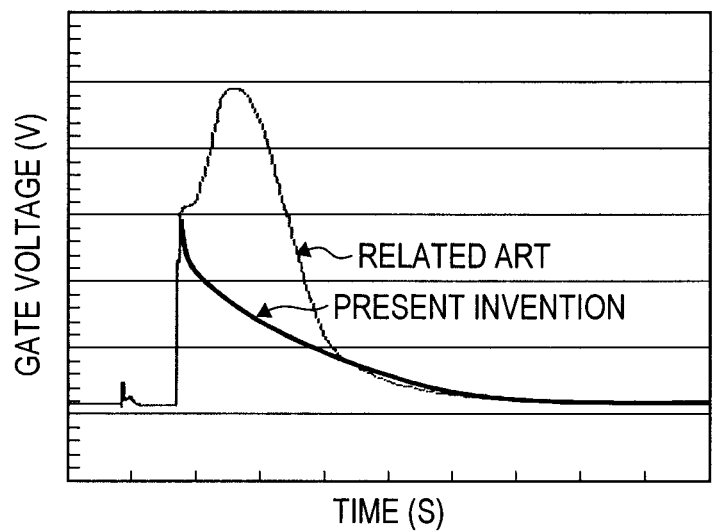
FIG. 4B is a diagram showing variations in the gate voltages of output transistors disposed in the output circuits according to the first and second embodiments.

Next, referring to FIGS. 4A and 4B, a mechanism will be described where the output circuit according to this embodiment suppresses overshoot or undershoot of its output waveform. FIG. 4A shows a simulation transient analysis waveform of the gate voltage of the output transistor (MP13 or MP103) in the positive amplifier. FIG. 4B shows a simulation transient analysis waveform of the gate voltage of the output transistor (MN24 or MN204) in the negative amplifier. The simulation results of FIGS. 4A and 4B correspond to the simulation result of FIG. 3. As is understood from the waveform of FIG. 4A, the output circuit 12 according to this embodiment clamps the gate voltage of the output transistor MP13 so that the gate voltage does not reach or fall below a predetermined voltage level. That is, the output circuit 12 clamps the gate voltage of the output transistor MP13 so that the gate-source voltage of the output transistor MP13 does not reach or exceed a predetermined voltage level. Similarly, as is understood from the waveform of FIG. 4B, the output circuit 22 according to this embodiment clamps the gate voltage of the output transistor MN24 so that the gate voltage does not reach or exceed a predetermined voltage level. That is, the output circuit 22 clamps the gate voltage of the output transistor MN24 so that the gate-source voltage of the output transistor MN24 does not reach or exceed a predetermined voltage level. Thus, the maximum value of the gate-source voltage is controlled to control the output signal so as not to cause overshoot or undershoot, and a required gate-source voltage is ensured. This can make it possible to control the output signal so that the settling time does not extend too much.

As seen, the output circuit according to this embodiment includes the clamping transistor between the gate and drain of the output transistor, restricting increases in the gate-source voltage of the output transistor. Thus, the output circuit according to this embodiment can restrict the drain current of the output transistor, suppressing overshoot or undershoot of its output waveform.

Note that the output circuit according to this embodiment is only required to additionally include a single clamping MOS transistor so as to suppress overshoot or undershoot. For this reason, the impact on the chip size is almost negligible.

Further, even if a p-n junction diode, instead of the diode-coupled MOS transistor, is used as a clamping circuit, similar advantages can be obtained in principle. However, where a p-n junction diode is used, the impedance abruptly decreases after the clamping voltage of about 0.6 to 0.7 V is exceeded. Thus, clamping works too much compared to where the diode-coupled MOS transistor is used. This results in an excessive reduction in the drive capability of the output transistor.

On the other hand, where the diode-coupled MOS transistor is used, the clamping voltage is the threshold voltage of the MOS transistor, and the impedance of the diode-coupled MOS transistor is higher than that of a p-n junction diode. This is because the transconductance gm of the diode-coupled MOS transistor is lower than that of a p-n junction diode by about one digit or more. For this reason, smoother clamp characteristics can be obtained in the use of the diode-coupled MOS transistor than in the use of a p-n junction diode. That is, the use of the diode-coupled MOS transistor is more suitable for obtaining the advantages of the present invention.

Second Embodiment

Figure 2A:
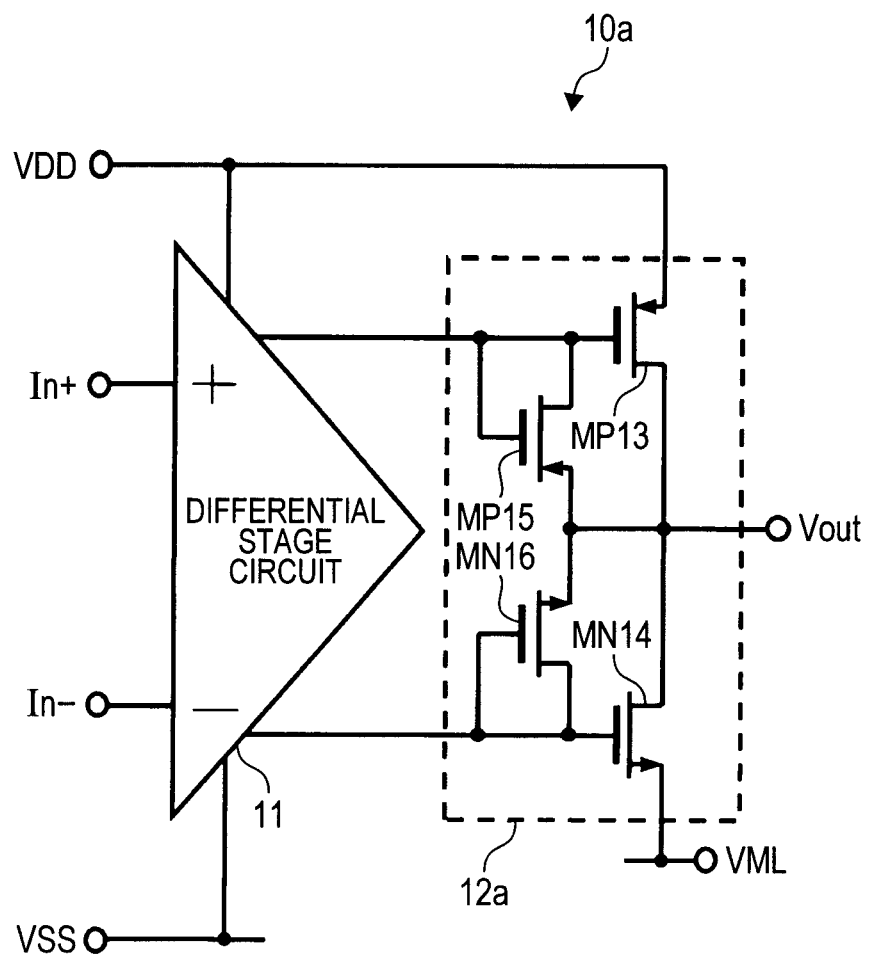
FIG. 2A is a circuit diagram showing an operational amplifier according to a second embodiment of the present invention.
Figure 2B:
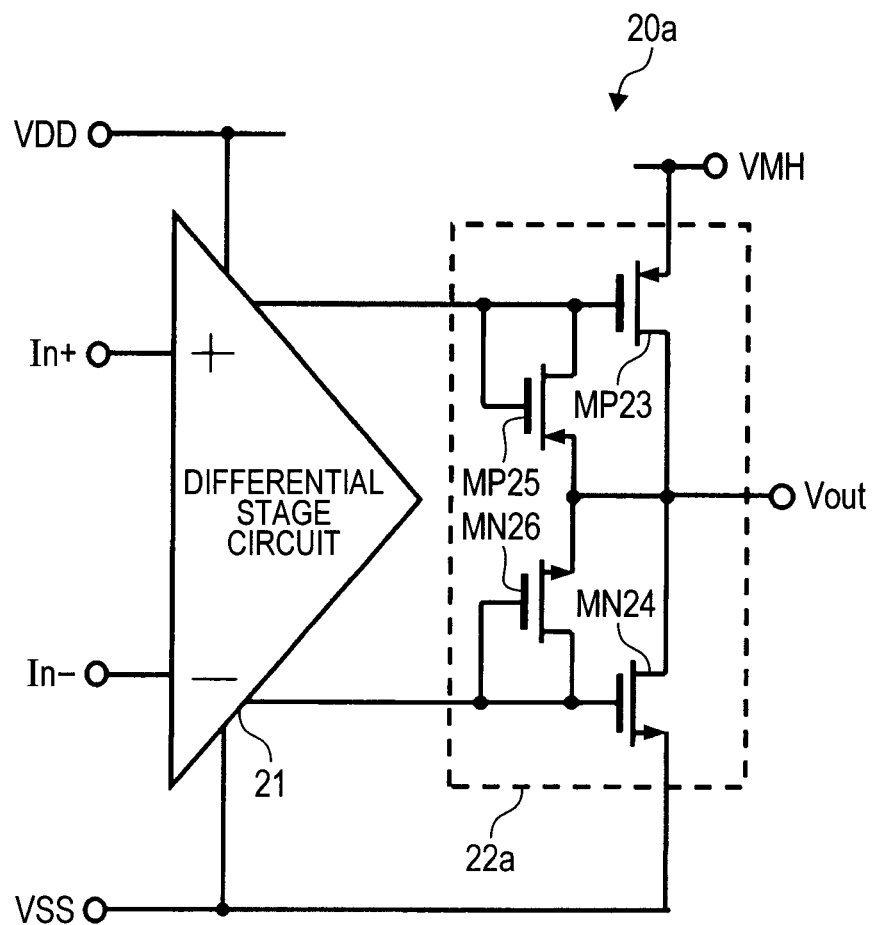
FIG. 2B is a circuit diagram showing an operational amplifier according to the second embodiment.

FIGS. 2A and 2B show a positive amplifier 10a and a negative amplifier 20a each including an output circuit according to a second embodiment of the present invention. Compared to the positive amplifier 10 shown in FIG. 1A, the positive amplifier 10a includes an output circuit 12a, which additionally includes a clamping transistor MN16, instead of the output circuit 12. Further, compared to the negative amplifier 20 shown in FIG. 2B, the positive amplifier 20a shown in FIG. 2B includes an output circuit 22a, which additionally includes a clamping transistor MP25, instead of the output circuit 22.

Specifically, in the positive amplifier 10a, the output circuit 12a includes the output transistors MP13 and MN14 and the clamping transistors MP15 and MN16. In this embodiment, it is assumed that the clamping transistor MN16 is an n-channel MOS transistor.

The clamping transistor MN16 has a first terminal and a gate (control terminal) which are commonly coupled to the gate of the output transistor MN14 and a second terminal coupled to the drain of the output transistor MN14. The first and second terminals of the clamping transistor MN16 are a set of a source and a drain which change places in accordance with the levels of voltages applied to them. The other circuit configuration in FIG. 2A is the same as that in FIG. 1A and will be omitted. As seen, the output circuit 12a according to this embodiment includes the clamping transistors MP15 and MN16 for the two output transistors, MP13 and MN14, respectively. Thus, the output circuit 12a according to this embodiment can balance parasitic capacitances that occur in the output transistors.

In the negative amplifier 20a of FIG. 2B, the output circuit 22a includes the output transistors MP23 and MN24 and the clamping transistors MP25 and MN26. In this embodiment, it is assumed that the clamping transistor MP25 is a p-channel MOS transistor.

The clamping transistor MP25 has a first terminal and a gate (control terminal) which are commonly coupled to the gate of the output transistor MP23 and a second terminal coupled to the drain of the output transistor MP23. The first and second terminals of the clamping transistor MP25 are a set of a source and a drain which change places in accordance with the levels of voltages applied to them. The other circuit configuration in FIG. 2B is the same as that in FIG. 1B and will be omitted. As seen, the output circuit output circuit 22a according to this embodiment includes the clamping transistors MP25 and MN26 for the two output transistors, MP23 and MN24, respectively. Thus, the output circuit output circuit 22a according to this embodiment can balances parasitic capacitances that occur in the output transistors.

In the positive amplifier 10 shown in FIG. 1A, the falling edge of the output waveform may undershoot if the intermediate voltage VML applied to the output circuit 12 is a low voltage near the ground voltage VSS. In the positive amplifier 10a shown in FIG. 2A, on the other hand, the gate voltage of the output transistor MN14 is clamped by the clamping transistor MN16. This restricts increases in the gate-source voltage of the output transistor MN14. Thus, the drain current of the output transistor MN14 is restricted. As a result, the positive amplifier 10 can suppress undershoot of its output waveform. The other circuit configuration in FIG. 2A is the same as those in FIG. 1A and will be omitted.

Likewise, in the negative amplifier 20 shown in FIG. 1B, the rising edge of its output waveform may overshoot if the intermediate voltage VMH applied to the output circuit 22 is a high voltage near the power supply voltage VDD. In the negative amplifier 20a shown in FIG. 2B, on the other hand, the gate voltage of the output transistor MP23 is clamped by the clamping transistor MP25. This restricts increases in the gate-source voltage of the output transistor MP23. Thus, the drain current of the output transistor MP23 is restricted. As a result, the negative amplifier 20a can suppress overshoot of its output waveform. The other circuit configuration in FIG. 2B is the same as that in FIG. 1B and will be omitted.

Due to the above-mentioned circuit configuration, the output circuit according to this embodiment can obtain advantages similar to those of the first embodiment. Further, the output circuit according to this embodiment can balance parasitic capacitances that occur in the output transistors, as well as can clamp the output signal to a voltage not higher than the applied power supply voltage even when the intermediate voltage (VML or VMH) is any voltage within the range of the ground voltage VSS to the power supply voltage VDD.

Third Embodiment

Figure 5A:
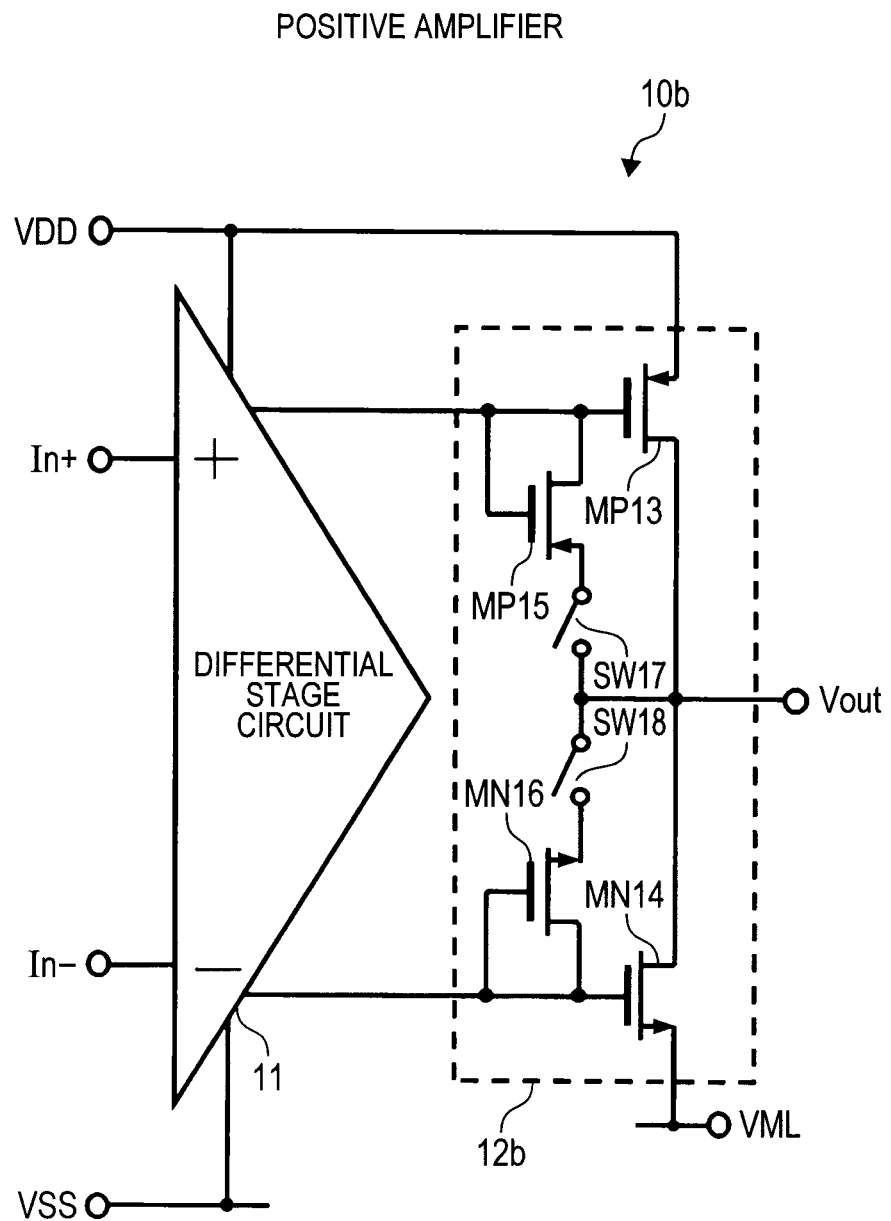
FIG. 5A is a circuit diagram showing an operational amplifier according to a third embodiment of the present invention.
Figure 5B:
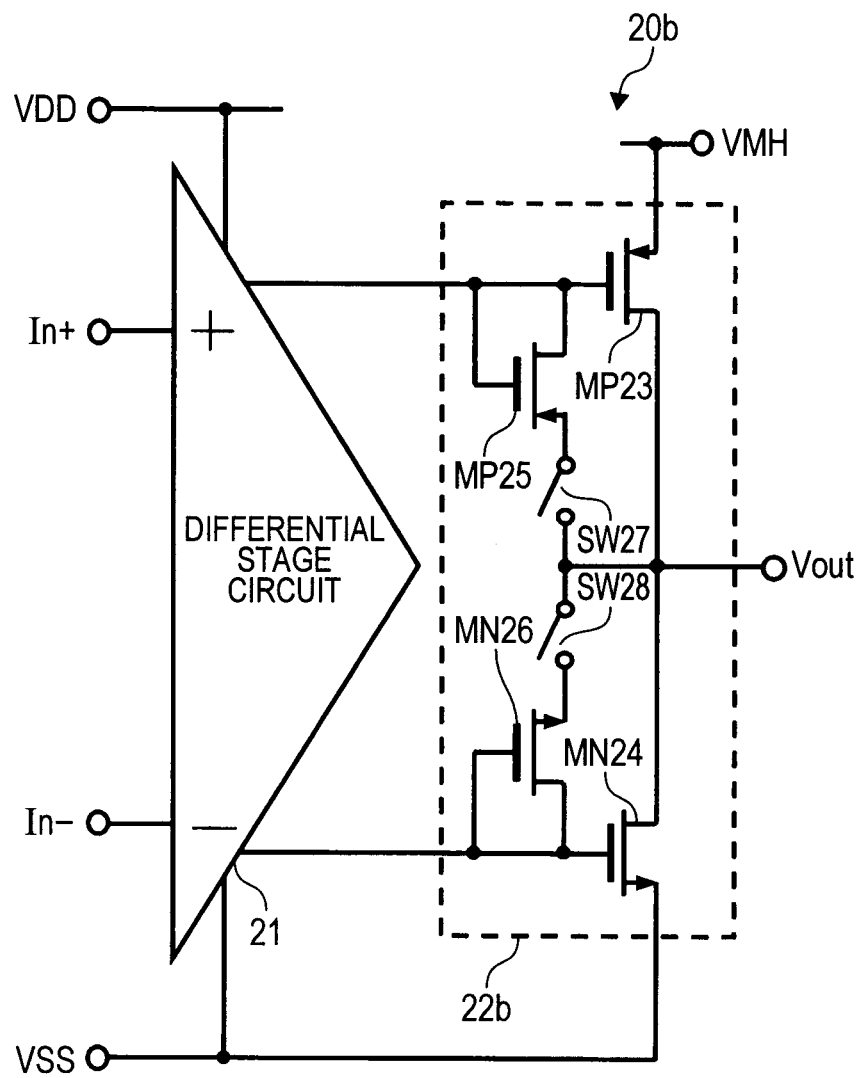
FIG. 5B is a circuit diagram showing an operational amplifier according to the third embodiment.

FIGS. 5A and 5B show a positive amplifier 10b and a negative amplifier 20b each including an output circuit according to a third embodiment of the present invention. Compared to the positive amplifier 10a shown in FIG. 2A, the positive amplifier 10b shown in FIG. 5A includes an output circuit 12b, which additionally includes switches SW17 and SW18, instead of the output circuit 12a. Compared to the negative amplifier 20a shown in FIG. 2B, the negative amplifier 20b shown in FIG. 5A includes an output circuit 22b, which additionally includes switches SW27 and SW28, instead of the output circuit 22a.

The output circuit according to this embodiment controls on/off of the two switches to control the timings at which the clamping transistors perform clamping. Thus, the output circuit according to this embodiment suppresses the extension of the settling time caused by clamping. This will be described below specifically.

In the positive amplifier 10b of FIG. 5A, the output circuit 12b includes the output transistors MP13 and MN14, the clamping transistors MP15 and MN16, and the switches SW17 and SW18. The switch SW17 is coupled between the second terminal of the clamping transistor MP15 and the external output terminal Vout. The switch SW18 is coupled between the second terminal of the clamping transistor MN16 and the external output terminal Vout. The other circuit configuration in FIG. 5A is the same as that in FIG. 2A and will be omitted.

In the negative amplifier 20b of FIG. 5B, the output circuit 22b includes the output transistors MP23 and MN24, the clamping transistors MP25 and MN26, and the switches SW27 and SW28. The switch SW27 is coupled between the second terminal of the clamping transistor MP25 and the external output terminal Vout. The switch SW28 is coupled between the second terminal of the clamping transistor MN26 and the external output terminal Vout. The other circuit configuration in FIG. 5B is the same as that in FIG. 2B and will be omitted.

Figure 6:
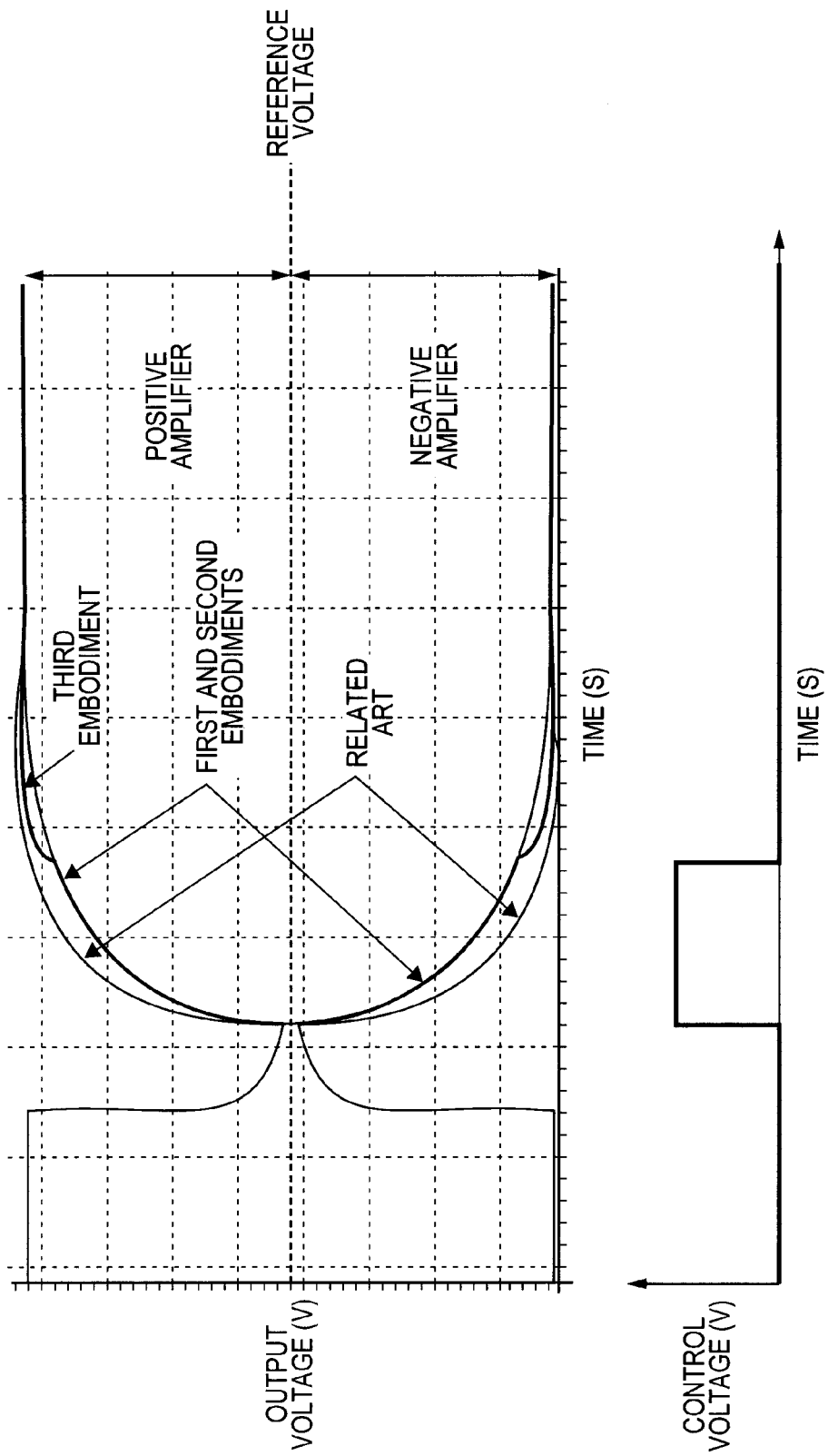
FIG. 6 is a diagram showing the output waveform of the output circuit according to the third embodiment.
Figure 7A:
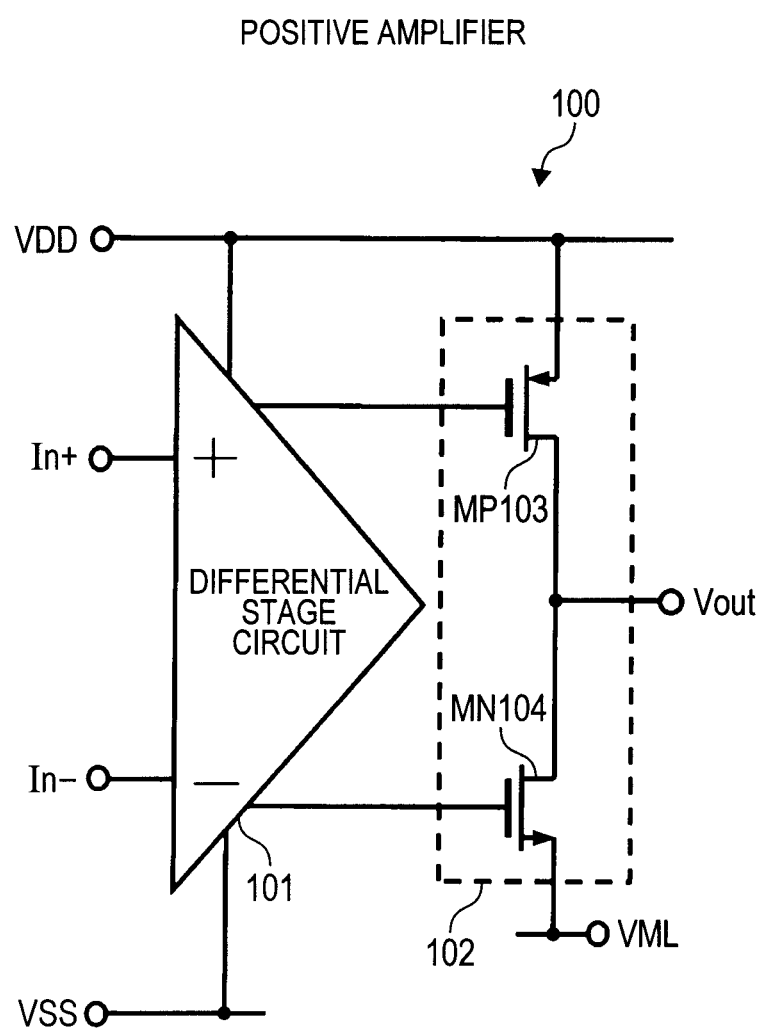
FIG. 7A is a circuit diagram showing an operational amplifier including an output circuit according to the related art.
Figure 7B:
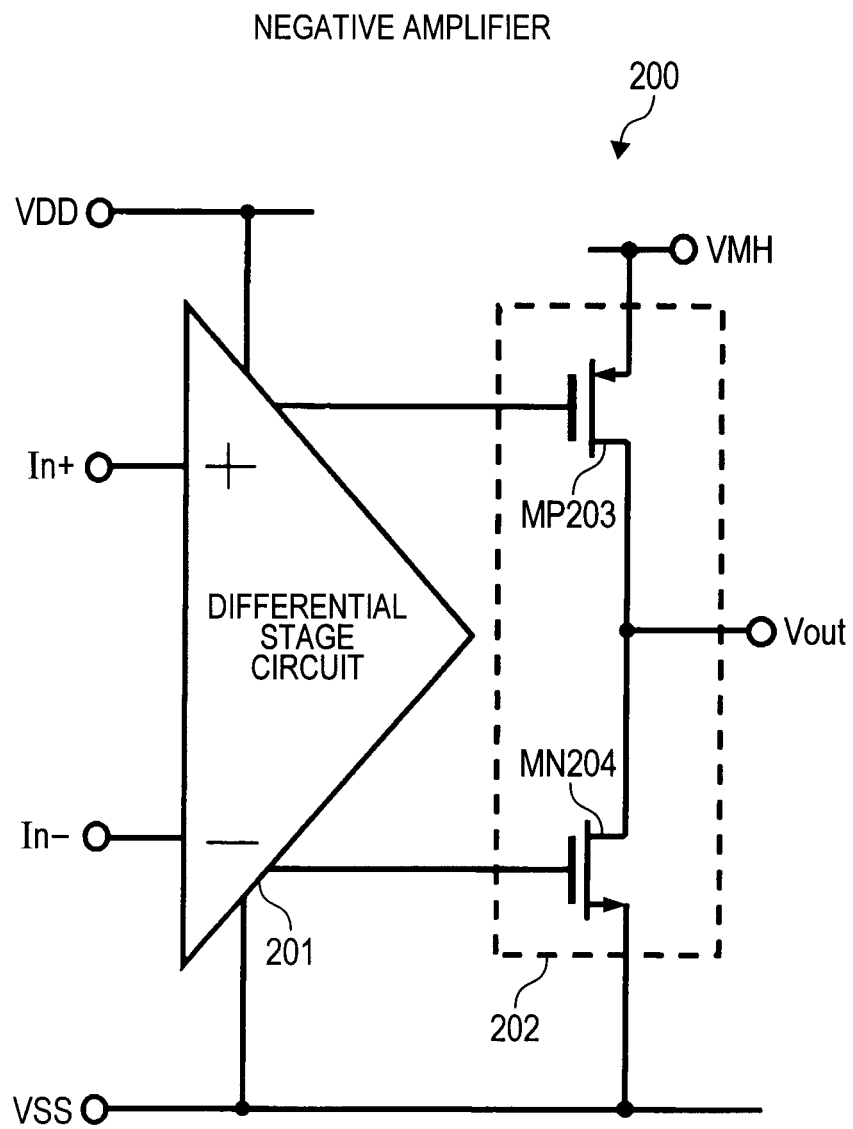
FIG. 7B is a circuit diagram showing an operational amplifier including an output circuit according to the related art.
Figure 8:
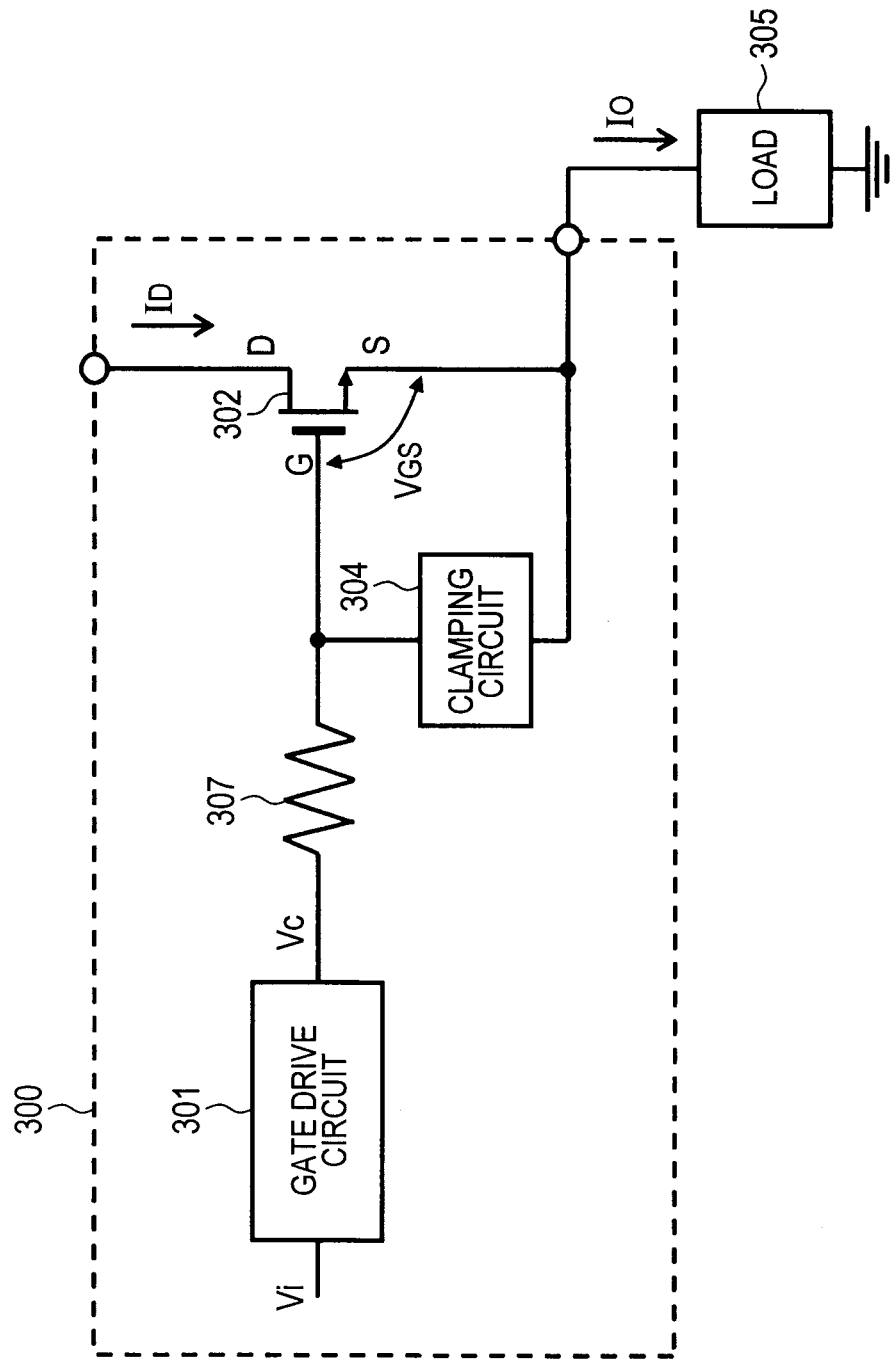
FIG. 8 is a circuit diagram showing an output circuit according to the related art.
Figure 9:
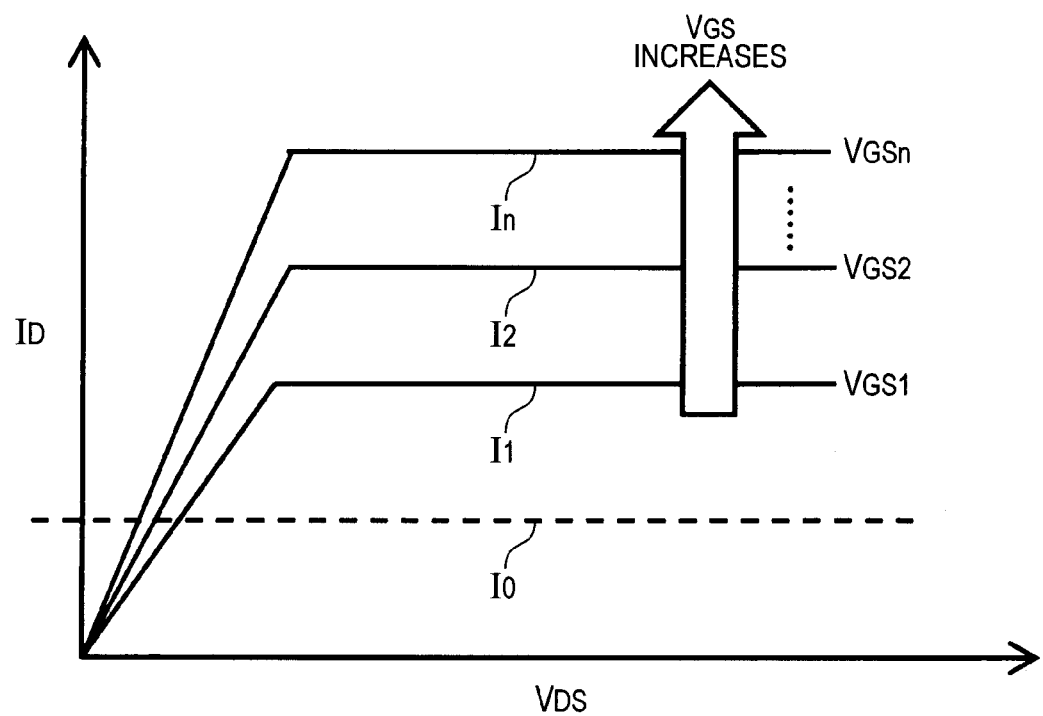
FIG. 9 is a graph showing ID-VDS characteristics of an MOS transistor.

FIG. 6 is a diagram obtained by adding to FIG. 3 the output waveforms of the positive amplifier 10b of FIG. 5A and the negative amplifier 20b of FIG. 5B. Here assume that the switches SW17 and SW18 are controlled in conjunction with each other. Also assume that the switches SW27 and SW28 are controlled in conjunction with each other. In the example of FIG. 6, the switches SW17, SW18, SW27, and SW28 are controlled so that the switches are on only during a certain period when which the control voltage is kept at an H level. That is, the output circuit according to this embodiment enables clamping by the clamping transistor until reaching some midpoint of the rising or falling edge of the output waveform, suppressing overshoot or undershoot. The output circuit then disables clamping so that the output waveform rapidly rises or falls, speeding up the settling time to the extent that overshoot or undershoot does not occur.

Each switch is turned on at the rising edge or falling edge of the STB period (a control signal outputted at the beginning of one horizontal period of the LCD driver), that is, at the first timing when the output varies and is kept on only for a certain period. The on time is controlled to an optimal time in accordance with the panel load.

As seen, the rising time of an output signal (through rate, for example, the time taken until the voltage level reaches from 10% to 90%) in the positive amplifier 10b shown in FIG. 5A is approximately equal to those in the positive amplifier 10 in FIG. 10A and the positive amplifier 10a shown in FIG. 2A, but the settling time (for example, the time taken until the voltage level reaches from 0.5% to 99.5% and stabilizes) in the former is shorter than that in the latter. Likewise, the falling time of an output signal (for example, the time taken until the voltage level reaches from 90% to 10%) in the negative amplifier 20b shown in FIG. 5B is approximately equal to those in the negative amplifier 20 shown in FIG. 1B and the negative amplifier 20a shown in FIG. 2B, but the settling time (for example, the time taken until the voltage level reaches from 99.5% to 0.5% and stabilizes) in the former is shorter than those in the latter. That is, the output circuit according to this embodiment can suppress overshoot or undershoot of its output waveform, as well as can suppress the extension of the settling time caused by clamping.

As seen, the output circuits according to the above-mentioned first to third embodiments include the clamping transistor(s) between the gate and drain of the output transistor(s) to restrict increases in the gate-source voltage of the output transistor(s). Thus, these output circuits can restrict the drain current of the output transistor(s), suppressing overshoot or undershoot of their output waveform.

As described above, Japanese Patent Application Publication No. Hei 3(1991)-117017 discloses a transistor output circuit which includes a clamping circuit and where the source of an output transistor is coupled to an external output terminal. The clamping circuit used in this circuit is a circuit for clamping a current during operation of a source follower and is disposed between the gate and source of the output transistor. In the output circuits according to the above-mentioned embodiments, on the other hand, the drains of the output transistors are coupled to the external output terminal. The clamping circuit(s) (clamping transistor(s)) used in these circuits is disposed between the gate and source of the output transistor(s). Accordingly, the output circuits according to the embodiments and that according to this related art example have different circuit configurations.

Further, this related art example uses the source of the output transistor as the reference of the clamping voltage and clamps the gate voltage using the source voltage as the reference. In this case, the related art example requires a clamping circuit having Zener diode characteristics in order to restrict the output current and therefore is different from this application using the MOS transistor as the clamping circuit. If an active Zener or the like which is equivalent to a Zener diode and includes an MOS transistor and a resistor is used as a clamping circuit, the number of elements is increased and the circuit configuration is complicated. This increases the chip size, resulting in an increase in cost.

Further, as described above, Japanese Patent No. 4228960 discloses a load drive apparatus including clamping circuits coupled between the gates and drains of two MOS transistors (output transistors) (see FIG. 5 of the Patent). Each clamping circuit includes a diode for backflow prevention and a clamping Zener diode. This related art example clamps the drain voltage of the MOS transistor using the gate voltage thereof. The output circuits according to the embodiments, on the other hand, clamp the gate of the output transistor using the drain voltage thereof. That is, the output circuits according to the embodiments and this related art example have different circuit configurations, as well as different objects and advantages.

Further, the use of a Zener diode as a clamping circuit in this related art example abruptly reduces the impedance after the clamping voltage (breakdown voltage) is exceeded. Thus, this related art example causes excessive clamping compared to the output circuits according to the embodiments. This results in an excessive reduction in the drive capability of the output transistor. On the other hand, the use of the diode-coupled MOS transistor(s) as a clamping circuit(s) in the output circuits according to the embodiments allows obtaining smoother clamping characteristics than in this related art example, as described above. That is, use of a diode-coupled MOS transistor is more suitable for obtaining the advantages of the present invention.

Further, as described above, Japanese Patent Application Publication No. Hei7(1995)-505994 discloses an inductive load damp circuit including a p-channel clamping transistor (clamping circuit) coupled between the gate and drain of an n-channel MOS transistor (output transistor) (see FIG. 3 of the Publication). The power supply voltage Vcc is applied to the gate of the clamping transistor (P1). This related art example clamps the drain voltage of the transistor (N1) using the gate voltage of the clamping transistor (P1). The output circuits according to the embodiments, on the other hand, clamp the gate voltage of the output transistor using the drain voltage thereof. That is, the output circuits according to the embodiments and the related art example have different circuit configurations, as well as different objects and advantages.

The present invention is not limited to the above-mentioned embodiments, and changes can be made to the embodiments as appropriate without departing from the spirit and scope of the invention.

What is claimed is:

1. An output circuit comprising:
   a first output MOS transistor disposed between a first power supply terminal and an external output terminal, a current flowing from the source of the first output MOS transistor to the drain thereof being controlled on the basis of an external input signal;
   a second output MOS transistor disposed between a second power supply terminal and the external output terminal, a current flowing from the source of the second output MOS transistor to the drain thereof being controlled on the basis of an external input signal; and
   a first clamping MOS transistor having a first terminal and a control terminal, the first terminal and the control terminal being coupled to the gate of the first output MOS transistor, and a second terminal coupled to the drain of the first output MOS transistor,
   wherein the first output MOS transistor and the first clamping MOS transistor are p-channel MOS transistors,
   wherein the second output MOS transistor is an n-channel MOS transistor, a higher-potential power supply voltage is applied to the first power supply terminal, and
   wherein an intermediate voltage between the higher-potential power supply voltage and a lower-potential power supply voltage is applied to the second power supply terminal.

2. The output circuit according to claim 1, further comprising:
   a second clamping MOS transistor having a first terminal and a control terminal, the first terminal and the control terminal being coupled to the gate of the second output MOS transistor, and a second terminal coupled to the drain of the second output MOS transistor,
   wherein the first output MOS transistor and the first clamping MOS transistor are p-channel MOS transistors,
   wherein the second output MOS transistor and the second clamping MOS transistor are p-channel MOS transistors,
   wherein a higher-potential power supply voltage is applied to the first power supply terminal, and
   wherein an intermediate voltage between a higher-potential power supply voltage and a lower-potential power supply voltage is applied to the second power supply terminal.

3. The output circuit according to claim 1, further comprising:
   a second clamping MOS transistor having a first terminal and a control terminal, the first terminal and the control terminal being coupled to the gate of the second output MOS transistor, and a second terminal coupled to the drain of the second output MOS transistor,
   wherein the first output MOS transistor and the first clamping MOS transistor are n-channel MOS transistors,
   wherein the second output MOS transistor and the second clamping MOS transistor are p-channel MOS transistors,
   wherein a lower-potential power supply voltage is applied to the first power supply terminal, and
   wherein an intermediate voltage between the higher-potential power supply voltage and the lower-potential power supply voltage is applied to the second power supply terminal.

4. An output circuit comprising:
   a first output MOS transistor disposed between a first power supply terminal and an external output terminal, a current flowing from the source of the first output MOS transistor to the drain thereof being controlled on the basis of an external input signal;
   a second output MOS transistor disposed between a second power supply terminal and the external output terminal, a current flowing from the source of the second output MOS transistor to the drain thereof being controlled on the basis of an external input signal; and
   a first clamping MOS transistor having a first terminal and a control terminal, the first terminal and the control terminal being coupled to the gate of the first output MOS transistor, and a second terminal coupled to the drain of the first output MOS transistor,
   wherein the first output MOS transistor and the first clamping MOS transistor are n-channel MOS transistors,
   wherein the second output MOS transistor is a p-channel MOS transistor, a lower-potential power supply voltage is applied to the first power supply terminal, and
   wherein an intermediate voltage between a higher-potential power supply voltage and the lower-potential power supply voltage is applied to the second power supply terminal.

5. An output circuit comprising:
   a first output MOS transistor disposed between a first power supply terminal and an external output terminal, a current flowing from the source of the first output MOS transistor to the drain thereof being controlled on the basis of an external input signal;
   a second output MOS transistor disposed between a second power supply terminal and the external output terminal, a current flowing from the source of the second output MOS transistor to the drain thereof being controlled on the basis of an external input signal;
   a first clamping MOS transistor having a first terminal and a control terminal, the first terminal and the control terminal being coupled to the gate of the first output MOS transistor, and a second terminal coupled to the drain of the first output MOS transistor;

a first switch coupled in series to the first clamping MOS transistor, on/off of the first switch being controlled in accordance with a variation in the voltage level of the external output terminal.

* * * * *

UNITED STATES PATENT AND TRADEMARK OFFICE
CERTIFICATE OF CORRECTION

PATENT NO. : 8,604,844 B2
APPLICATION NO. : 13/195546
DATED : December 10, 2013
INVENTOR(S) : Kouichi Nishimura, Hiromichi Ohtsuka and Toshikazu Murata It is certified that error appears in the above-identified patent and that said Letters Patent is hereby corrected as shown below:

In the Claims:

Column 13, Line 66: In Claim 2, delete "p-channel" and insert -- n-channel --

Column 14, Line 3: In Claim 2, delete "a" and insert -- the --

Column 14, Line 22: In Claim 3, delete "the" and insert -- a --

Signed and Sealed this
Twenty-fourth Day of June, 2014

Michelle K. Lee
*Deputy Director of the United States Patent and Trademark Office*